United States Patent [19]

Nakagawa et al.

[11] Patent Number: 4,926,243

[45] Date of Patent: May 15, 1990

[54] HIGH VOLTAGE MOS FIELD EFFECT SEMICONDUCTOR DEVICE

[75] Inventors: Kiyotoshi Nakagawa, Fukuyama; Kenzo Kawano, Nara, both of Japan

[73] Assignee: Sharp Kabushiki Kaisha, Osaka, Japan

[21] Appl. No.: 169,160

[22] Filed: Mar. 9, 1988

Related U.S. Application Data

[63] Continuation of Ser. No. 819,216, Jan. 15, 1986, abandoned.

[30] Foreign Application Priority Data

Jan. 19, 1985 [JP]  Japan ................................. 60-7776

[51] Int. Cl.[5] ........................................... H01L 25/04
[52] U.S. Cl. .................... 357/84; 357/23.14; 357/41; 357/50; 357/52; 357/53; 357/54; 357/55; 357/23.7
[58] Field of Search ............... 357/23.14, 84, 41, 50, 357/52, 53, 54, 55, 23.7

[56] References Cited

U.S. PATENT DOCUMENTS

| | | | |
|---|---|---|---|
| 4,177,480 | 12/1979 | Hintzmann | 357/84 |
| 4,194,214 | 3/1980 | Awan et al. | 357/41 |
| 4,290,077 | 9/1981 | Ronen | 357/41 |
| 4,519,050 | 5/1985 | Folmsbee | 357/84 |
| 4,536,941 | 8/1985 | Kuo et al. | 357/84 |

OTHER PUBLICATIONS

A. G. Fortino et al., Method of Making a Submicron Field-Effect Transistor, IBM Technical Disclosure Bulletin, vol. 23, No. 2, pp. 534–556, (Jul., 1980).

T. Yamaguchi et al., Process and Device Design of a 1000-V MOS IC, IEEE Transactions on Electron Devices, vol. ED-29, No. 8, pp. 1171–1178, (Aug. 1982).

L. D. Hartsough et al., Aluminum and Aluminum Alloy Sputter Deposition for VLSI, Solid State Technology, pp. 66–72, (Dec., 1979).

*Primary Examiner*—Edward J. Wojciechowicz
*Attorney, Agent, or Firm*—Cohen, Pontani & Lieberman

[57] ABSTRACT

A high voltage MOS field-effect semiconductor device comprising, as formed on a single seimconductor substrate a high voltage first MOS field-effect transistor and a conventional second MOS field-effect transistor operable at a lower voltage than the first transistor. The semiconductor substrate is covered with an aluminum or like conductor layer over the region thereof where the conventional second field-effect transistor is located.

14 Claims, 4 Drawing Sheets

HIGH VOLTAGE MOS FIELD EFFECT SEMICONDUCTOR DEVICE

This is a continuation, of U.S. application Ser. No. 819,216, filed Jan. 15, 1986 now abandoned.

BACKGROUND OF THE INVENTION

1. Field of the Invention

The present invention relates to a semiconductor device (hereinafter referred to as "high voltage MOS IC") comprising a high voltage MOS field-effect transistor and a usual low voltage MOS field-effect transistor for driving the transistor which are formed on a single semiconductor substrate.

2. Description of the Prior Art

Drivers for display panels such as EL panel, PDP, etc. or other high voltage drivers comprise a plurality of high voltage MOS field-effect transistors and low voltage logic circuits as disclosed in U.S. Pat. No. 4,194,214. These components are usually arranged in such a pattern that the transistors are disposed at the peripheral portion of a die, with the circuits positioned at the center of the die.

With high voltage MOS IC's of such a construction, a high voltage is applied to the die peripheral portion surrounding the low voltage logic circuits, so that a groove of potential occurs on the pattern of low voltage logic circuits, and external charges accumulate in this portion. This influences the IC substrate, leading to the drawback of inverting the field portion of the low voltage MOS field-effect transistor constituting the logic circuit and inducing a malfunction of the circuit.

Although Examined Japanese Patent Publications SHO 48-14153 and SHO 48-28826 disclose a technique for electrically shielding the device region within semiconductor substrates, the technique is still unable to completely eliminate the influence of high voltage applied to the logic circuit-surrounding peripheral portion of an MOS IC of the above construction.

SUMMARY OF THE INVENTION

In a semiconductor device comprising a high voltage MOS field-effect transistor and a low voltage logic circuit both provided on a single semiconductor substrate, the pattern of low voltage logic circuit C as positioned at the center of a die A is covered with an aluminum or other conductor layer D according to the present invention as shown in FIG. 1 of the drawing to assure the logic circuit of stable operation free of the influence of external charges. A circuit B of high voltage MOS field-effect transistor is provided at the peripheral portion of the die A.

Thus, by substantially completely covering the logic circuit C with an aluminum or other conductor layer from above, with an insulating layer interposed therebetween, and electrically connecting the layer to the IC substrate, GND terminal, low voltage power supply or the like, the influence of external charges on the IC substrate can be potentially completely blocked, whereby the high voltage MOS IC can be made highly reliably free of the likelihood that the field portion of the low voltage MOS field-effect transistor constituting the logic circuit will be inverted to induce a malfunction of the circuit.

The conductor layer, which is characteristic of the present invention, is prepared usually from aluminum. When the conductor layer is formed of aluminum containing about 1% of silicon, the layer covers the semiconductor portion with improved adhesion thereto. Although the process for forming the conductor layer is not specifically limited, vacuum evaporation is convenient and effective. While the conductor layer substantially completely covers the semiconductor portion (logic circuit C), the term "substantially completely" covering layer with respect to the is to be interpreted as also meaning a plurality of conductor layers which are maintained at electrically the same potential.

With the above-mentioned high voltage MOS field-effect transistor, it is desirable that the region of high resistance layer present between the source electrode and the drain electrode be covered with a conductor extending from the source electrode, as well as from the drain electrode, and further with a plurality of floating conductors. The high resistance layer can then be free of the influence of external charges and maintain high voltage.

DESCRIPTION OF THE PREFERRED EMBODIMENTS

Figure 1:
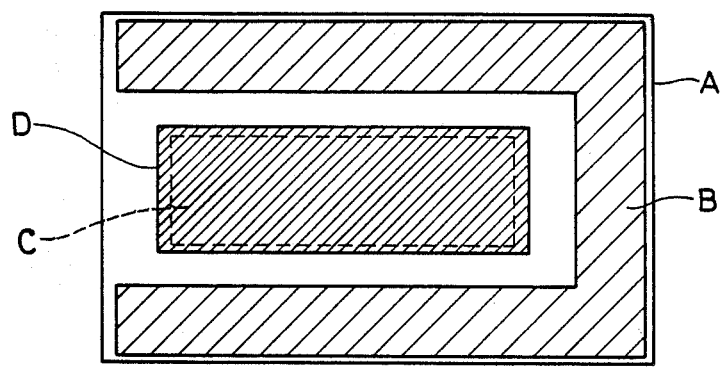
FIG. 1 is a plan view schematically showing the structure of a semiconductor chip according to the present invention.
Figure 2A:
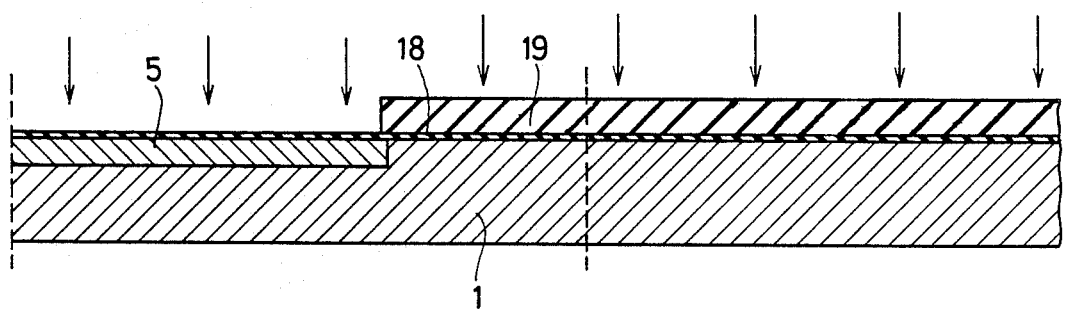
FIGS. 2 (a) to (f) are sectional views for illustrating a process for fabricating a semiconductor device embodying the present invention.
Figure 2B:
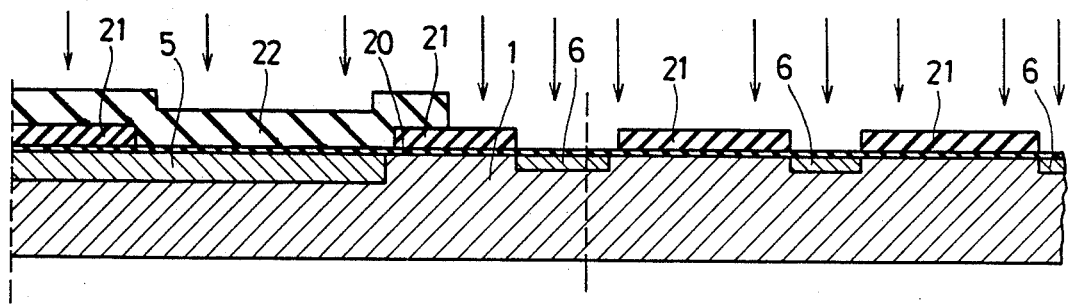
Figure 2C:
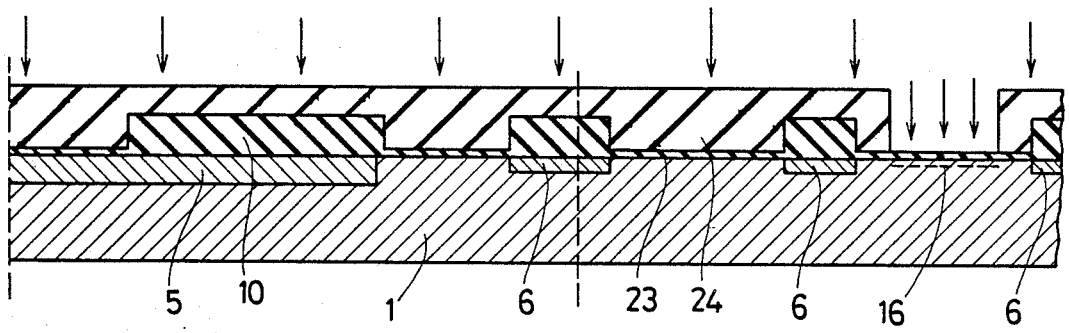
Figure 2D:
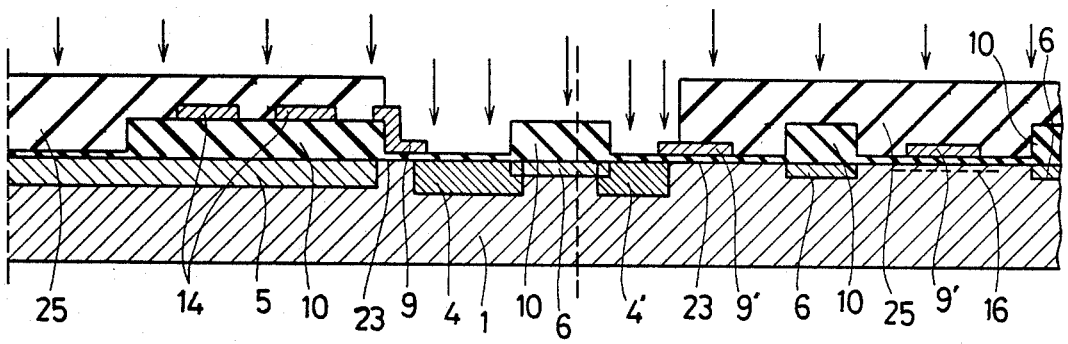
Figure 2E:
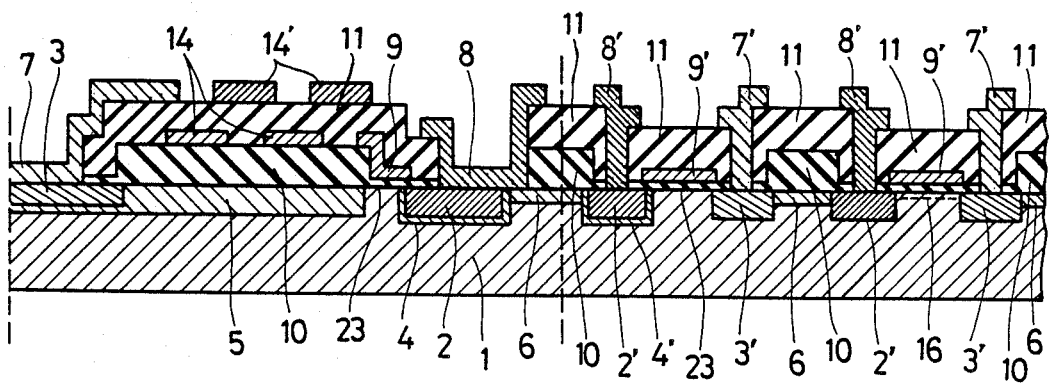
Figure 2F:
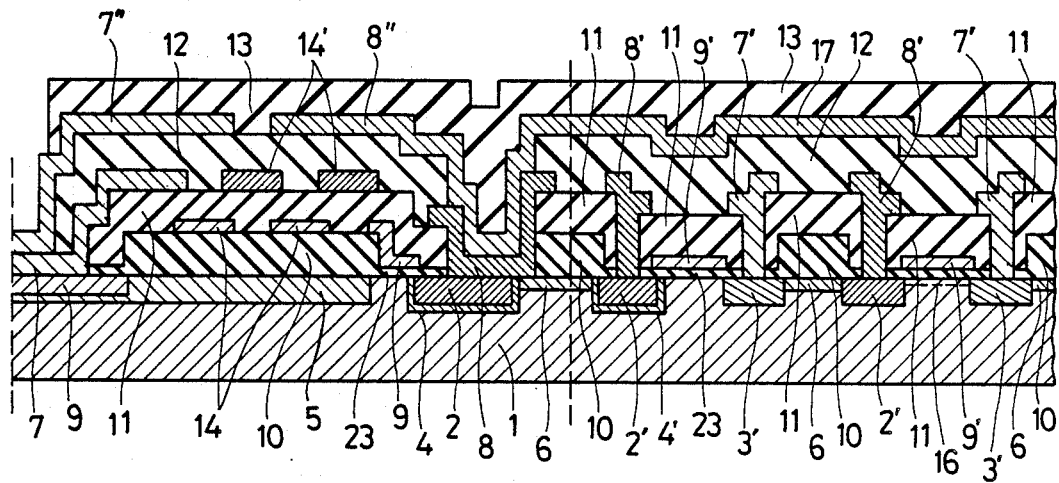

In the following description, it is assumed that the left side region of the substrate provides a high voltage MOS FET, and the right side region thereof a low voltage logic circuit as seen in FIG. 2.

The semiconductor substrate 1 to be used is a P-type substrate having a low impurity concentration. $^{31}P+$ ions are implanted in the surface of the substrate through a thin oxide film 18, using a resist 19 for masking, followed by diffusion to form a high resistance layer (FIG. 2 (a)).

Next, the thin oxide film 18 is etched away from the substrate, a thin oxide film 20 is grown again, and a silicon nitride film 21 is deposited on the film by the vapor phase growth process. Subsequently, openings are formed for channel, source and drain regions by photoetching. With the resulting substrate locally covered with a resist 22, $^{11}B+$ ions are implanted by a self-alignment process to form $P^+$ regions 6 (FIG. 2 (b)).

With use of the silicon nitride film 21 for masking, the substrate is then subjected to selective oxidation to form a thick oxide film 10. The silicon nitride film and the underlying thin oxide film are thereafter removed, and a thin oxide film 23 is grown again over the removed area. Further with use of a resist 24 for masking, $^{31}P+$ ions are implanted to form a channel portion 16 of a depression type transistor (FIG. 2 (c)).

Polycrystalline silicon is then deposited by the vapor phase growth process, the deposit is removed from unnecessary areas, and gate electrodes 9 and 9' and floating electrodes 14 are formed. Next, the resulting surface is locally masked with a resist 25, and $^{11}B+$ ions are implanted, followed by diffusion to form P+regions 4 and 4' (FIG. 2 (d)).

The substrate is further doped with phosphorus by self-alignment diffusion or ion implantation to form source regions 2, 2' and drain regions 3, 3'. A thick insulating film 11 is then deposited by the vapor phase growth process, and drain contact portions and source contact portions are opened by etching. An aluminum or like conductor layer is thereafter deposited over the entire surface by vacuum evaporation or sputtering, and the undesired portions are removed to form source electrodes 8, 8', drain electrodes 7, 7' and floating conductors 14' (FIG. 2 (e)).

A thick insulating film 12 is further deposited by the vapor phase growth process. Through holes are then formed in the film for the drain electrode, source electrode and like portions of the high voltage MOS FET. A conductor layer of aluminum containing 1% of silicon is deposited again by vacuum evaporation over the entire surface, except where unnecessary, to form a field plate 8" extending from the source electrode 8, a field plate 7" extending from the drain electrode 7, and a shield plate 17 potentially shielding the logic circuit and characterizing the present invention. Finally, a protective film 13 is formed to complete the high voltage MOS IC (FIG. 2 (f)).

Figure 3:
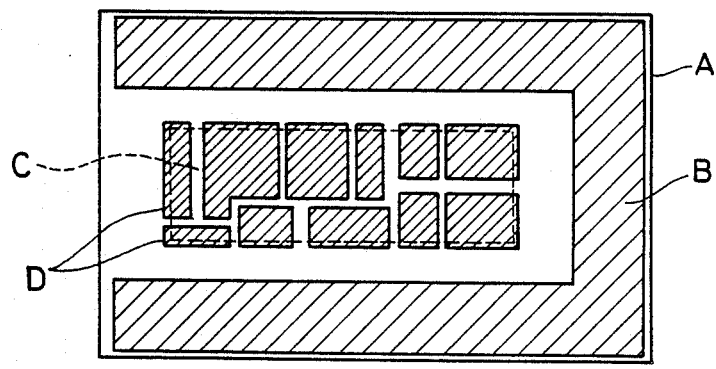
FIG. 3 is a plan view schematically showing another embodiment of a semiconductor chip of the present invention.

As another embodiment of the present invention, the selective oxide film, for example, may be replaced by an insulating film formed by the vapor phase growth process. Although the shield plate 17 is connected to the source of the high voltage MOS FET and the substrate according to the above embodiment, the plate may be connected to the power supply for applying low voltage to the logic circuit. The shield plate 17 may be divided into a plurality of segments D as seen in FIG. 3 corresponding to FIG. 1. In this case, each plate segment needs to be connected to the source of the high voltage MOS FET, to the substrate or the low voltage power supply.

Figure 4A:
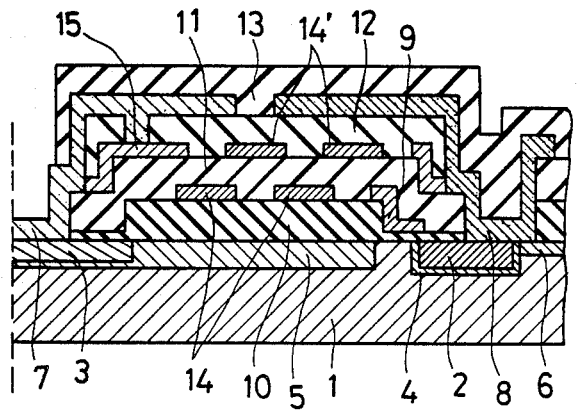
FIGS. 4 (a) and (b) are sectional views showing semiconductor substrates for illustrating high voltage MOS FETs of the invention and a the prior art, respectively.
Figure 4B:
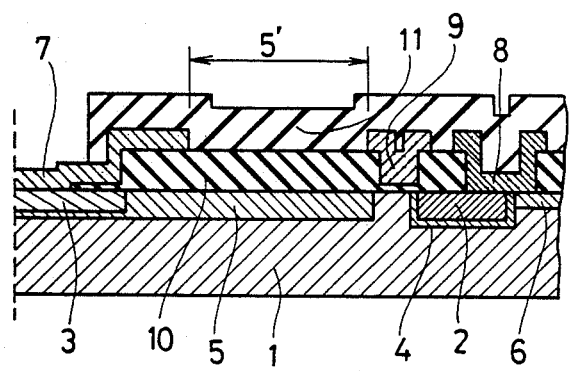

FIGS. 4 (a) and (b) show high voltage MOS FETs of the present invention and the prior art, respectively.

The conventional high voltage MOS FET shown in FIG. 4 (b) has a P-type substrate 1 which is formed with an N+ source region 2 and an N+ drain region 3. A P+ region 4 for the gate channel of the FET is formed around the source region 2 by a self-alignment process. Further connected to the drain region 3 is a high resistance layer 5 of the same conduction type.

When the semiconductor substrate having impurities diffused therethrough as above is provided with a source electrode 8 connected to the N+ source region 2 and a drain electrode 7 connected to the N+ drain region 3, there is a region 5' of high resistance layer between the gate electrode and the drain electrode which region is not covered with a conductor such as aluminum or polycrystalline silicon. The uncovered region 5' of high resistance layer is susceptible to the influence of external charges and results in the problem that when checked by a high-temperature bias test or the like, the device undergoes variations in electric characteristics such as voltage resistance, drain current, on resistance, etc. during operation. To assure improved reliability by overcoming this problem, the high voltage MOS FET fabricated by the process of FIG. 2 has a construction which withstands high voltage and in which the high resistance layer is made free of the influence of external charges. With reference to FIG. 4 (a) showing this construction, the corresponding region of the high resistance layer is completely covered with a source electrode 8, a drain electrode 7 and a plurality of floating conductors 14'.

What is claimed is:

1. A high voltage MOS field-effect semiconductor device, comprising:
    a semiconductor substrate;
    a high voltage MOS field-effect transistor formed on the substrate and operable for switching a relatively high voltage applied thereto, said high voltage transistor comprising a source electrode, a drain electrode and a region of high resistance layer between said source and drain electrodes;
    a circuit including a low voltage MOS field-effect transistor formed of a plurality of electrically conductive and electrically insulating layers predeterminately stacked on said substrate for driving said high voltage MOS field-effect transistor;
    electromagnetic shielding means comprising an electrically conductive layer overlying substantially the entirety of said circuit and entirely separated and spaced from said substrate by at least some of said plural stacked layers for screening said low voltage circuit portion from electromagnetic radiation from said high voltage transistor on the substrate and preventing electrical interference with said overlaid circuit by the electromagnetic field effects of the relatively high voltage operatively applied to said high voltage transistor;
    an insulating layer interposed between said circuit and said electronically conductive layers of said shielding means;
    said semiconductor device having an upper surface comprising a protective film;
    a first conductive field plate extending from said source electrode, said first field plate being connected to said shielding means; and
    a second conductive field plate extending from said drain electrode, said first and second field plates being disposed in overlying relation to said region of high resistance layer.

2. A device as defined in claim 1 wherein the semiconductor substrate has the high voltage MOS field-effect transistor disposed at a peripheral portion thereof and the low voltage MOS field-effect transistor disposed centrally thereof.

3. A device as defined in claim 1 wherein the high voltage MOS field-effect transistor has a plurality of floating conductors.

4. A device as defined in claim 1 wherein the conductor layer is formed of aluminum containing about 1% of silicon.

5. A device as defined in claim 1 wherein the conductor layer is connected to a source of the high voltage MOS field-effect transistor, the semiconductor substrate or a power supply of the low voltage MOS field-effect transistor.

6. A device as defined in claim 1 wherein the conductor layer is divided into a plurality of segments which are connected to a source of the high voltage MOS field-effect transistor, the semiconductor substrate or a power supply of the low voltage MOS field-effect transistor.

7. A device as defined in claim 2 wherein the high voltage MOS field-effect transistor has a plurality of floating conductors.

8. A device as defined in claim 2 wherein the conductor layer is connected to a source of the high voltage MOS field-effect transistor, the semiconductor substrate or a power supply of the low voltage MOS field-effect transistor.

9. A device as defined in claim 2 wherein the conductor layer is divided into a plurality of segments which are connected to a source of the high voltage MOS field-effect transistor, the semiconductor substrate or a power supply of the low voltage MOS field-effect transistor.

10. A high voltage MOS field-effect semiconductor device, comprising:
   a semiconductor substrate;
   a high voltage MOS field-effect transistor formed at a peripheral portion on said substrate and operable for switching a relatively high voltage applied thereto, said high voltage transistor comprising a source electrode, a drain electrode and a region of high resistance layer between said source and drain electrodes;
   a circuit including a low voltage MOS field-effect transistor formed at a central portion on said substrate and at least partly surrounded by said high voltage MOS field-effect transistor for driving said high voltage transistor; and
   electromagnetic shielding means comprising a plurality of electrically conductive layers overlying said circuit and electrically connected to a constant electric potential for screening said low voltage circuit portion from electromagnetic radiation from said high voltage transistor on the substrate and preventing electrical interference with said overlaid circuit by the electromagnetic field effects of the relatively high voltage operatively applied to said high voltage transistor;
   an insulating layer interposed between said circuit and said electrically conductive layers of said shielding means;
   said semiconductor device having an upper surface comprising a protective film;
   a first conductive field plate extending from said source electrode, said first field plate being connected to said shielding means; and
   a second conductive field plate extending from said drain electrode, said first and second field plates being disposed in overlying relation to said region of high resistance layer.

11. A high voltage MOS field-effect semiconductor device, comprising;
   a semiconductor substrate;
   a first circuit including high voltage MOS field-effect transistors integrally formed at a peripheral portion on said substrate and operable for switching a relatively high voltage applied thereto, each of said high voltage transistors comprising a source electrode, a drain electrode and a region of high resistance layer between said source and drain electrodes;
   a second circuit including low voltage MOS field-effect transistors integrally formed at a central portion on said substrate and at least partly surrounded by said first circuit;
   electromagnetic shielding means comprising a plurality of electrically conductive layers overlying substantially the entirety of said central portion having said second circuit and electrically connected to a constant electric potential for screening said second circuit from electromagnetic radiation from said high voltage transistors of said first circuit on the substrate and preventing electrical interference with said overlaid second circuit by the electromagnetic field effects of the relatively high voltage operatively applied to said high voltage transistors;
   an insulating layer interposed between said circuit and said electrically conductive layers of said shielding means;
   said semiconductor device having an upper surface comprising a protective film;
   a first conductive field plate extending from said source electrode, said first field plate being connected to said shielding means; and
   a second conductive field plate extending from said drain electrode, said first and second field plates being disposed in overlying relation to said region of high resistance layer.

12. A device in accordance with claim 11, wherein said conductive layers are comprised of metal and are deposited by vacuum evaporation over said insulating layer.

13. A device in accordance with claim 11, wherein said conductive layers are formed of aluminum containing about 1% of silicon.

14. A device in accordance with claim 11 wherein each said high voltage MOS field-effect transistor has a plurality of floating third conductors.

* * * * *